United States Patent
Nomura et al.

(10) Patent No.: US 8,801,457 B2
(45) Date of Patent: Aug. 12, 2014

(54) CONNECTING STRUCTURE AND CONNECTING METHOD FOR FLEXIBLE FLAT CABLE

(75) Inventors: Shoichi Nomura, Kosai (JP); Goro Nakamura, Kosai (JP)

(73) Assignee: Yazaki Corporation, Tokyo (JP)

( * ) Notice: Subject to any disclaimer, the term of this patent is extended or adjusted under 35 U.S.C. 154(b) by 6 days.

(21) Appl. No.: 13/381,113

(22) PCT Filed: Jun. 18, 2010

(86) PCT No.: PCT/JP2010/060393
§ 371 (c)(1),
(2), (4) Date: Dec. 28, 2011

(87) PCT Pub. No.: WO2011/001839
PCT Pub. Date: Jan. 6, 2011

(65) Prior Publication Data
US 2012/0100750 A1 Apr. 26, 2012

(30) Foreign Application Priority Data
Jul. 2, 2009 (JP) ................................ 2009-157870

(51) Int. Cl.
*H01R 12/00* (2006.01)
(52) U.S. Cl.
USPC ........................................................ 439/492
(58) Field of Classification Search
USPC .................................................. 439/492–499
See application file for complete search history.

(56) References Cited

U.S. PATENT DOCUMENTS

| 5,860,831 A | 1/1999 | Roder et al. |
| 2002/0102875 A1* | 8/2002 | Durocher ...................... 439/493 |

FOREIGN PATENT DOCUMENTS

| CN | 1264195 A | 8/2000 |
| JP | 654227 U | 7/1994 |
| JP | 8-162228 A | 6/1996 |
| JP | 2001-217030 A | 8/2001 |
| JP | 2002-025651 A | 1/2002 |
| JP | 2002-170627 A | 6/2002 |
| JP | 2002-280690 A | 9/2002 |
| JP | 2004327400 A | 11/2004 |
| JP | 2008210741 A | 9/2008 |
| JP | 2009-087833 A | 4/2009 |

OTHER PUBLICATIONS

International Search Report (PCT/ISA/210) dated Aug. 3, 2010, issued in International Application No. PCT/JP2010/060393.
Written Opinion (PCT/ISA/237) dated Aug. 3, 2010, issued in International Application No. PCT/JP2010/060393.
Communication dated Jun. 4, 2013 from the Japanese Patent Office in counterpart Japanese application No. 2009-157870.

(Continued)

*Primary Examiner* — Ross Gushi
(74) *Attorney, Agent, or Firm* — Sughrue Mion, PLLC

(57) ABSTRACT

A flexible flat cable connecting structure for connecting a flexible flat cable in which a plurality of rectangular conductors are provided in parallel and a plurality of connector terminals arranged at an array pitch different from that of the rectangular conductors comprises an intermediate cable arranging member one end of which is coupled to the connector terminals and in which a plurality of branch conductors are provided in parallel which are set to have mutually different longitudinal dimensions according to the array pitch. The intermediate cable arranging member is laid on the flexible flat cable so that the intermediate cable arranging member and the flexible flat cable are in the same plane and form an angle. The other ends of the branch conductors of the intermediate cable arranging member are connected to the respective rectangular conductors.

12 Claims, 8 Drawing Sheets

(56) References Cited

OTHER PUBLICATIONS

Extended European Search Report dated Jul. 23, 2013 issued by the European Patent Office in counterpart European Application No. 10794009.0.

Office Action dated Dec. 18, 2013 issued by the State Intellectual Property Office of the People's Republic of China in counterpart Chinese Patent Application No. 201080030127.8.

* cited by examiner

CONNECTING STRUCTURE AND CONNECTING METHOD FOR FLEXIBLE FLAT CABLE

TECHNICAL FIELD

The invention is related to a flexible flat cable connecting structure and a flexible flat cable connecting method for connecting a flexible flat cable to various electronic equipments such as connectors, in particular to a technical improvement that makes it possible to connect connectors without expanding the conductor pitch of a flexible flat cable.

BACKGROUND ART

An FFC (Flexible Flat Cable) 501 as shown in FIGS. 12A, 12B and 12C is formed by aligning strips of thin, flexible conductors (rectangular conductors) 503 and molding them integrally with a sheet-like insulating coating 505, and is often used with various electronic equipments in automobile control systems or the like. Generally, the pitch P1 of the rectangular conductors 503 of the FFC 501 often does not match the pitch P2 of the connector terminals 509 of the connector 507. For example, when the pitch P2 (3.00 mm) of the connector terminals 509 is bigger than the pitch P1 (1.50 mm) of the FFC 501 as in the figure, it is difficult to connect, and it is necessary to use a FFC 501 in which the pitch P1 of the rectangular conductors matches with the pitch P2 of the connector terminals.

Thus, to eliminate such defects, for example, a connector connecting structure of a cable is disclosed in Patent Literature 1 in which, as shown in FIG. 13, wires 513 and 515 exposed from an end of a cable 511 which is an FFC are aligned to have the same pitch as that of connector terminals not shown in the figure, such aligned wires 513 and 515 are molded integrally with insulating material (for example, thermoplastic polyimide) to form a mold part 517, and a sealing part 519 of the connector is formed integrally with the above insulating material. Thus, workability and tightness of the connector connecting structure are favorable.

In addition, a FFC connector 537 is disclosed in Patent Literature 2 in which, as shown in FIG. 14, rectangular conductors 523 of an FFC 521 are inserted through a direction converting chip 525 having slits, the direction of the rectangular conductors 523 is converted from a horizontal direction a to a perpendicular direction b by sliding a rack 531 accommodated between a first housing 527 and a second housing 529 to rotate the direction converting chip 525, the rectangular conductors 523 whose direction is converted and whose pitch is reduced by a pitch converting piece 533 are inserted through a conductor supporter 535, and the rectangular conductors 523 are connected to a counterpart connector by being exposed at an opening part provided at the conductor supporter 535.

CITATION LIST

[Patent Literatures]
[Patent Literature 1] JP-A-2002-25651
[Patent Literature 2] JP-A-8-162228

SUMMARY OF INVENTION

Technical Problem

However, for the connector connecting structure disclosed in Patent Literature 1, each time the pitch changes, a different metal mold for forming the mold part is required. In order to manufacture all connector terminals that match pitches of the terminals of various connected equipments, a huge number of metal molds are required, and productivity falls. In addition, although the pitch conversion of the FFC connector 537 disclosed in Patent Literature 2 is variable, since the rack 531 and the direction converting chip 525 are accommodated between the first housing 527 and the second housing 529, and the pitch converting piece 533 which converts the pitch of the rectangular conductors 523 whose direction is changed must be included, the connector structure becomes complicated and productivity falls.

The invention is made in view of the above-mentioned situation, and a purpose of the invention is to provide a flexible flat cable connecting structure and a flexible flat cable connecting method so that metal molds for forming mold parts become unnecessary, pitches can be converted without complicating the connector structure, and productivity increases.

Solution to Problem

The above purposes of the invention are achieved by the following configurations.

(1) A flexible flat cable connecting structure for connecting a flexible flat cable in which a plurality of rectangular conductors are provided in parallel and a plurality of connector terminals arranged at an array pitch different from that of the rectangular conductors, the flexible flat cable connecting structure comprising:

an intermediate cable arranging member, one end of which is coupled to the connector terminals, and in which a plurality of branch conductors are provided in parallel, the branch conductors being set to have mutually different longitudinal dimensions according to the array pitch, wherein the intermediate cable arranging member is laid on the flexible flat cable so that the branch conductors and the rectangular conductors form a predetermined angle, and the other ends of the branch conductors of the intermediate cable arranging member are respectively connected to the rectangular conductors.

According to the flexible flat cable connecting structure, the intermediate cable arranging member is laid on the flexible flat cable having a plurality of rectangular conductor provided in parallel at an arbitrary pitch so that the intermediate cable arranging member and the flexible flat cable are in the same plane and form an angle, and the branch conductors are connected to the respective rectangular conductor at desired positions along the longitudinal direction of the rectangular conductors. The pitch of the rectangular conductors can be arbitrarily converted to the separating distance of the respective branch conductors which are connected with the rectangular conductors at a certain angle (perpendicularly).

(2) The flexible flat cable connecting structure according to (1), wherein the connector terminals are integrally formed with the branch conductors.

According to the flexible flat cable connecting structure, one end of the branch conductor becomes the connector terminal so that the branch conductor can be directly connected to the connector. Therefore, the intermediate cable arranging member, whose branch conductor are connected to the connector in advance, is as a whole connected to the flexible flat cable, or the connector is installed to the connector terminal of the intermediate cable arranging member which is connected to the flexible flat cable in advance by the branch conductor. Thus the flexibility of assembly increases.

(3) The flexible flat cable connecting structure according to (1) or (2), wherein a sheath of the branch conductors is formed by resin coating.

According to the flexible flat cable connecting structure, the plurality of branch conductors, which are provided in parallel at a predetermined pitch, are integrally formed with the sheath by being separated by the sheath (the resin coating), and become the flexible flat cable that is insulating and flexible.

(4) The flexible flat cable connecting structure according to (3), wherein the resin coating is silicon.

According to the flexible flat cable connecting structure, since the sheath integrally formed with the plurality of the branch conductors are made of silicon, the intermediate cable arranging member has good flexibility, and it is easy to connect the intermediate cable arranging member with the flexible flat cable and the connector.

(5) The flexible flat cable connecting structure according to (3) or (4), wherein a packing inserted in a connector housing is integrally molded with the sheath.

According to the flexible flat cable connecting structure, when the intermediate cable arranging member and the connector are connected, the gap between the intermediate cable arranging member, which is guided out from the connector housing, and the cable guiding opening is sealed by the packing. In other words, without assembling another packing, the insertion of the intermediate cable arranging member and the formation of the watertight structure are complete at the same time.

(6) The flexible flat cable connecting structure according to (3) or (4), wherein a packing setting part configured to position a packing is formed on the sheath of the intermediate cable arranging member at a position close to the connector terminals.

According to the flexible flat cable connecting structure, the packing setting part is formed on the sheath of the intermediate cable arranging member, the alternative packing can be attached to the sheath. Therefore, the flexibility of selecting materials of the packing increases, and it is possible to replace a deteriorated packing.

(7) The flexible flat cable connecting structure according to any one of (1) to (6), wherein the intermediate cable arranging member is laid on the flexible flat cable so that the branch conductors and the rectangular conductors form a nearly right angle.

According to the flexible flat cable connecting structure, the intermediate cable arranging member can be laid on the flexible flat cable to form with the flexible flat cable an arbitrary angle, but in particular when the intermediate cable arranging member is laid perpendicular to the flexible flat cable, compared to the case where the intermediate cable arranging member is laid obliquely, the pitch of the rectangular conductors 11 of the flexible flat cable can be converted in a smaller pitch converting area (that is, the area of the width W of the intermediate cable arranging member). In other words, space-saving pitch conversion becomes possible.

(8) The flexible flat cable connecting structure according to any one of (1) to (7), wherein a plurality of the intermediate cable arranging members are provided, and the connector terminals for respective intermediate cable arranging members are inserted and locked in different arranging regions of a connector housing.

According to the flexible flat cable connecting structure, a plurality of intermediate cable arranging member are connected to one plane-shaped flexible flat cable, and the respective intermediate cable arranging member are arranged in different planes. Thus, it is possible to connect to the different stages of cable guiding openings which are formed in multiple stages at the rear end of the connector housing. In other words, not only pitch conversion (column conversion) but also stage conversion (row conversion) of the cable guiding openings becomes possible.

(9) A flexible flat cable connecting method for connecting a flexible flat cable in which a plurality of rectangular conductors are provided in parallel and a plurality of connector terminals arranged at an array pitch different from that of the rectangular conductors, the flexible flat cable connecting method comprising:

laying an intermediate cable arranging member, one end of which is coupled to the connector terminals and in which a plurality of branch conductors are provided in parallel, on the flexible flat cable so that the branch conductors and the rectangular conductors form a predetermined angle, the branch conductors being set to have mutually different longitudinal dimensions according to the array pitch; and connecting the other ends of the branch conductors of the intermediate cable arranging member to the rectangular conductors respectively.

According to the flexible flat cable connecting method, the intermediate cable arranging member is laid on the flexible flat cable having a plurality of rectangular conductor provided in parallel at an arbitrary pitch so that the intermediate cable arranging member and the flexible flat cable are in the same plane and form an angle, and the branch conductors are connected to the respective rectangular conductor 11 at desired positions along the longitudinal direction of the rectangular conductors 11. The pitch of the rectangular conductors can be arbitrarily converted to the separating distance of the respective branch conductors which are connected with the rectangular conductors at a certain angle (perpendicularly).

Advantageous Effect of Invention

According to the flexible flat cable connecting structure of the invention, the intermediate cable arranging member, one end of which is coupled to the connector terminals and in which a plurality of branch conductor set to have longitudinal dimensions that are different from each other according to the array pitch are provided in parallel, is laid on the flexible flat cable so that the intermediate cable arranging member and the flexible flat cable are in the same plane and form an angle, and the other ends of the branch conductor are connected to the respective rectangular conductor of the flexible flat cable. Thus, the pitch of the rectangular conductor can be arbitrarily converted to the separating distance of the respective branch conductor which are connected with the rectangular conductor at a certain angle (perpendicularly). The flexible flat cable can be connected to a connector by pitch conversion without complicating the structure of the connector, and metal molds for forming mold parts become unnecessary. As a result, productivity can be improved.

According to the flexible flat cable connecting method of the invention, the step of laying the intermediate cable arranging member, one end of which is coupled to the connector terminals and in which a plurality of branch conductor set to have longitudinal dimensions that are different from each other according to the array pitch are provided in parallel, on the flexible flat cable so that the intermediate cable arranging member and the flexible flat cable are in the same plane and form an angle, and the step of connecting the other ends of the branch conductor of the intermediate cable arranging member to the respective rectangular conductor are performed. Thus, the pitch of the rectangular conductor can be arbitrarily converted to the separating distance of the respective branch conductor which are connected with the rectangular conductor at a certain angle (perpendicularly). The flexible flat cable which has the rectangular conductors with an arbitrary pitch can be connected to a connector by pitch conversion without complicating the structure of the connector, and metal molds for forming mold parts are not required. As a result, productivity can be improved.

DESCRIPTION OF EMBODIMENTS

Below, the embodiments of the invention are explained with reference to the figures.

Figure 1:
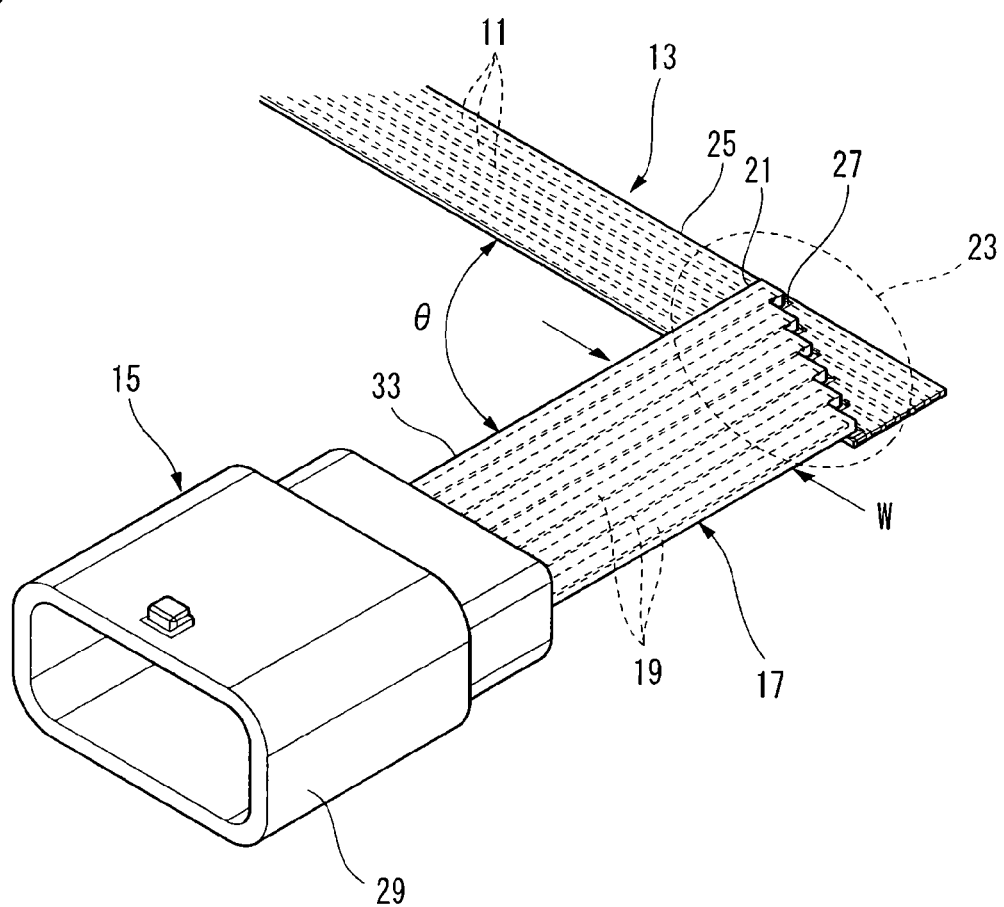
FIG. 1 is a perspective view of a connector and a flexible flat cable that are connected by a connecting structure of an embodiment of the invention.

FIG. 1 is a perspective view of a flexible flat cable and a connector that are connected by a connecting structure according to an embodiment of the invention.

The flexible flat cable connecting structure according to the embodiment can be suitably used to connect a flexible flat cable (hereafter referred to as FFC) 13 and a connector 15. Rectangular conductors 11, which are a plurality of belt-shaped conductors, are aligned in the FFC 13, and the connector 15 includes a plurality of connector terminals (described later) which are arranged at an array pitch different from that of the rectangular conductors 11. In addition, the connecting structure according to the invention is suitable for connecting various electronic equipments or something similar to the flexible flat cable.

In the connecting structure according to the embodiment, an intermediate cable arranging member 17 is used between the FFC 13 and the connector 15. The intermediate cable arranging member 17 has a plurality of branch conductors 19 that are aligned according to the array pitch of the connector terminals. The branch conductors 19 are formed to be belt-shaped on the same plane as that of the rectangular conductors 11, and are made of, for example, copper or copper alloys. The branch conductors 19 are set to have longitudinal dimensions that are mutually different according to the array pitch of the connector terminals, and are provided in parallel. Therefore, the other ends 21 of the branch conductors 19 become, for example, a stair-like shape as shown in the figure.

The intermediate cable arranging member 17 is laid on the FFC 13 so that the intermediate cable arranging member 17 and the FFC 13 are in the same plane and form an angle. In more detail, the intermediate cable arranging member 17 is laid on the FFC 13 so that a part of the branch conductors 19 of the intermediate cable arranging member 17 is located in a plane in which the plurality of rectangular conductors 11 of the FFC 13 is provided in parallel, and the longitudinal direction of the branch conductors 19 and the longitudinal direction of the rectangular conductors 11 form an angle θ. Each of the other ends 21 of the branch conductors 19 that are laid on the FFC 13 connects with each of the rectangular conductors 11 respectively in a joining part 23. The branch conductors 19 and the rectangular conductors 11 are connected by peeling an insulating coating 25 of the FFC 13.

The FFC 13 and the intermediate cable arranging member 17 are so arranged that the angle θ is a nearly right angle (90 degree). The intermediate cable arranging member 17 can be laid at an arbitrary angle θ. In particular, when the intermediate cable arranging member 17 is laid perpendicular to the FFC 13, compared to the case where the intermediate cable arranging member 17 is laid obliquely (for example, θ>90 degree), the pitch of the rectangular conductors 11 of the FFC 13 can be converted in a smaller pitch converting area (that is, the area of the width W of the intermediate cable arranging member 17). In other words, space-saving pitch conversion becomes possible.

Figure 2:
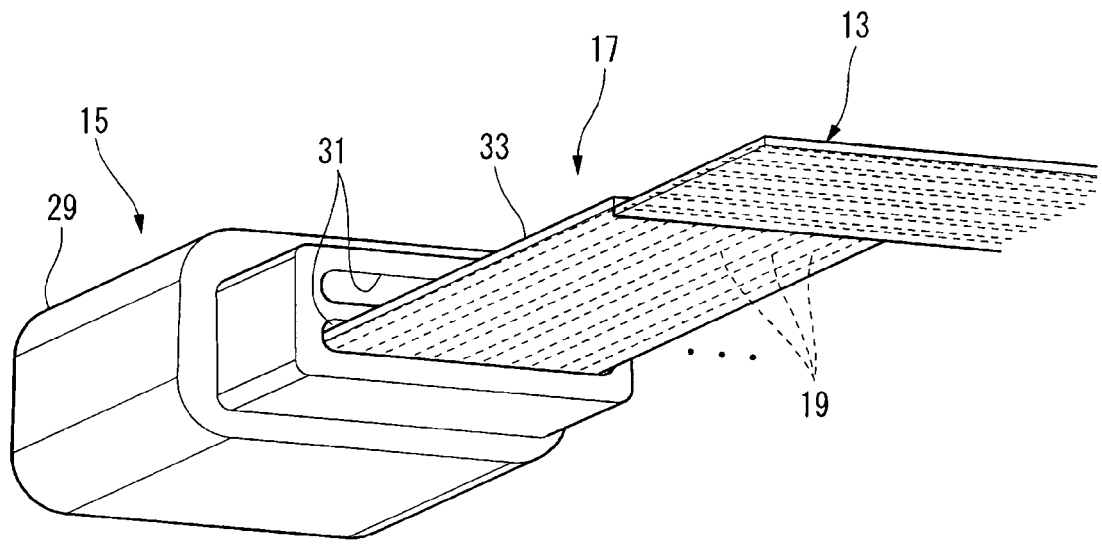
FIG. 2 is a perspective view in which the rear of the connector shown in FIG. 1 is seen.

FIG. 2 is a perspective view in which the rear of the connector shown in FIG. 1 is seen.

Cable guiding openings 31 are formed at the rear of a housing 29 of the connector 15. Although two cable guiding openings 31 are formed in the figure, it is also possible that one or more than two cable guiding openings 31 are formed. The intermediate cable arranging member 17 which is connected with the connector terminals inside the connector 15 is guided out of the cable guiding opening 31 to the outside of the housing 29. A watertight material not shown in the figure is injected to fill into the cable guiding opening 31, out of which the intermediate cable arranging member 17 is guided, by post-processing. The watertight material seals a gap between the cable guiding opening 31 and the intermediate cable arranging member 17 to prevent water from entering.

Figure 3:
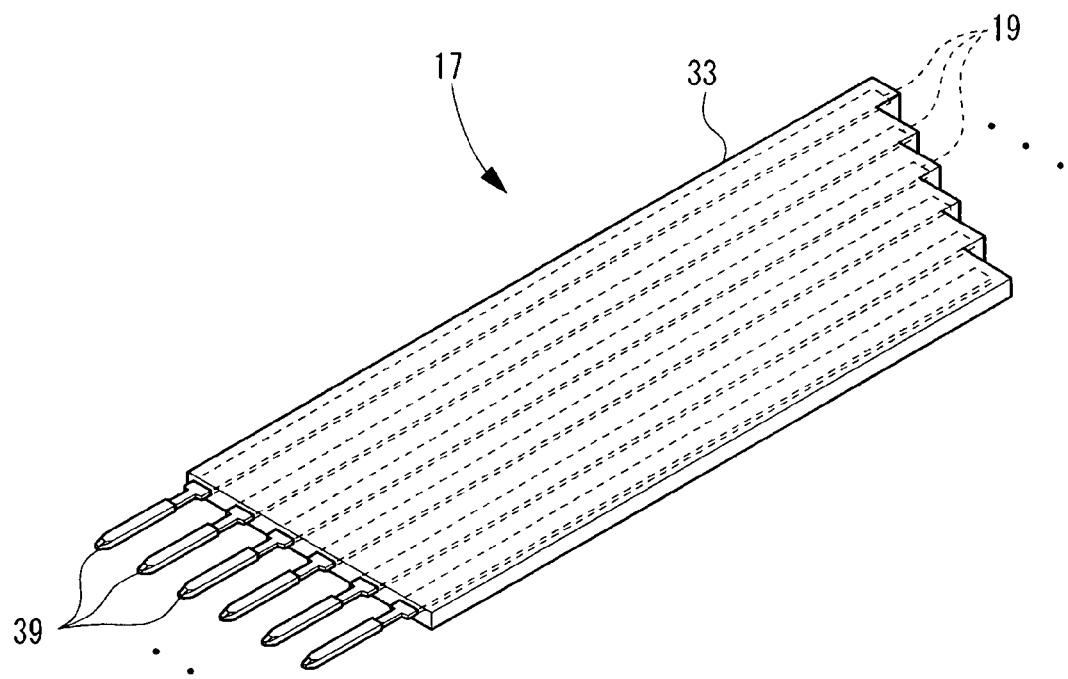
FIG. 3 is a perspective view of an intermediate cable arranging member shown in FIG. 1.

FIG. 3 is a perspective view of the intermediate cable arranging member shown in FIG. 1.

A sheath 33 of the intermediate cable arranging member 17, which is guided out of the cable guiding opening 31, is formed of such resin coatings as polypropylene (PP) or polybutylene terephthalate (PBT) coating. That is, a plurality of branch conductors 19, which are provided in parallel at a predetermined pitch that matches the array pitch of the connector terminals 39, are integrally formed with the sheath 33 by being separated by the sheath 33 (the resin coating), and become the flexible flat cable that is insulating and flexible. In this embodiment, silicon is used as the resin coating. Since the resin coating is silicon, the intermediate cable arranging member 17 has good flexibility, and it is easy to connect the intermediate cable arranging member 17 with the flexible flat cable and the connector. Further, the good flexibility makes it possible to easily insert the intermediate cable arranging member 17 as a whole into the connector 15.

Figure 4:
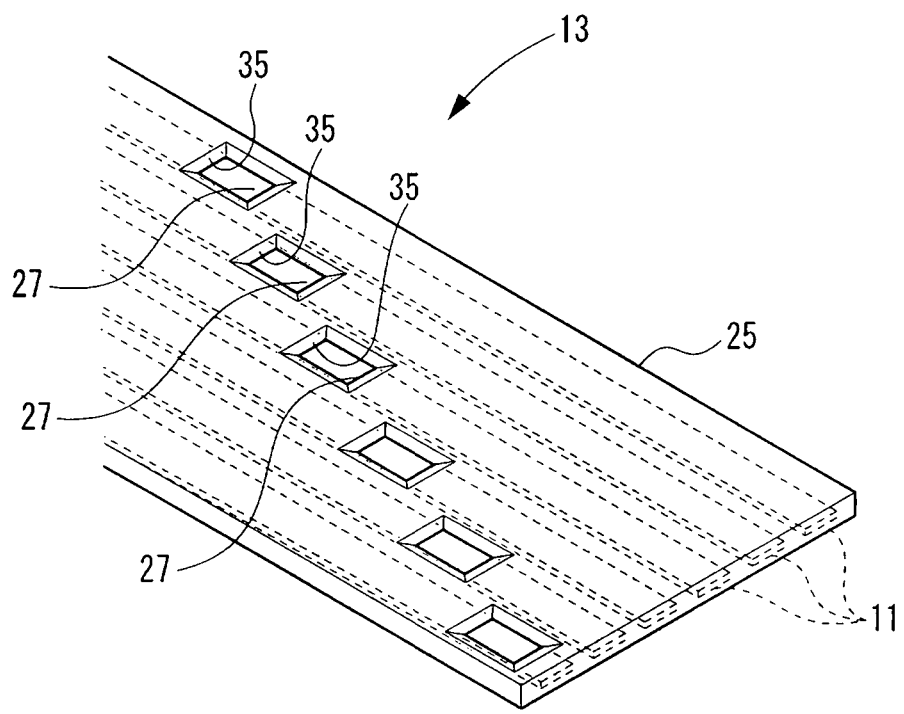
FIG. 4 is a perspective view of the flexible flat cable shown in FIG. 1.

FIG. 4 is a perspective view of the flexible flat cable shown in FIG. 1.

When the branch conductors 19 of the intermediate cable arranging member 17 are connected with the rectangular conductors 11 of the FFC 13, the rectangular conductors 11 are exposed at openings 35 which are formed by peeling the insulating coating 25 of the FFC 13, and the branch conductors 19 are connected to the exposed conductor exposed part 27 by such methods as ultrasonic welding, resistance welding, crimping, soldering and caulking.

In addition, when the FFC 13 and the intermediate cable arranging member 17 (connecting objects) are connected, either of the rectangular conductors 11 and the branch conductors 19 is exposed. By pressing the insulating coating 25 or the sheath 33 when the connecting parts of the connecting objects are heated, the insulating coating 25 or the sheath 33 is melted. In this way, the connecting objects are contacted. After that the connecting objects are welded by applying welding current or ultrasonic vibration.

Figure 5:
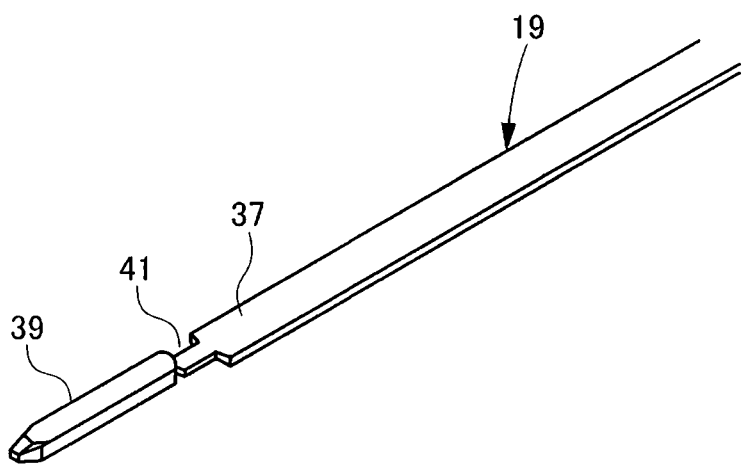
FIG. 5 is a perspective view of a branch conductor including a connector terminal shown in FIG. 3.

FIG. 5 is a perspective view of a branch conductor including a connector terminal shown in FIG. 3.

A connector terminal 39 is formed integrally with one end 37 of any one of the branch conductors 19 of the intermediate cable arranging member 17. "Formed integrally" means that, for example, when the branch conductors 19 are cut out from a raw board, the connector terminals 39 can be cut out simultaneously. In addition, the connector terminal 39 can be installed to the connector 15. For example, such a locking means as an indented part 41 can be included. Therefore, the branch conductors 19 will be held in the connector 15 by installing the connector terminals 39.

According to the intermediate cable arranging member 17, one end 37 of the branch conductor becomes the connector terminal 39, and the branch conductors 19 can be hold by the connector 15. Therefore, the intermediate cable arranging member 17, whose branch conductors 19 are hold in the connector 15 in advance, is as a whole connected to the FFC 13, or the connector 15 is installed to the connector terminals 39 of the intermediate cable arranging member 17 which is connected to the FFC 13 in advance by the branch conductors 19. Thus the flexibility of assembly increases.

Figure 6:
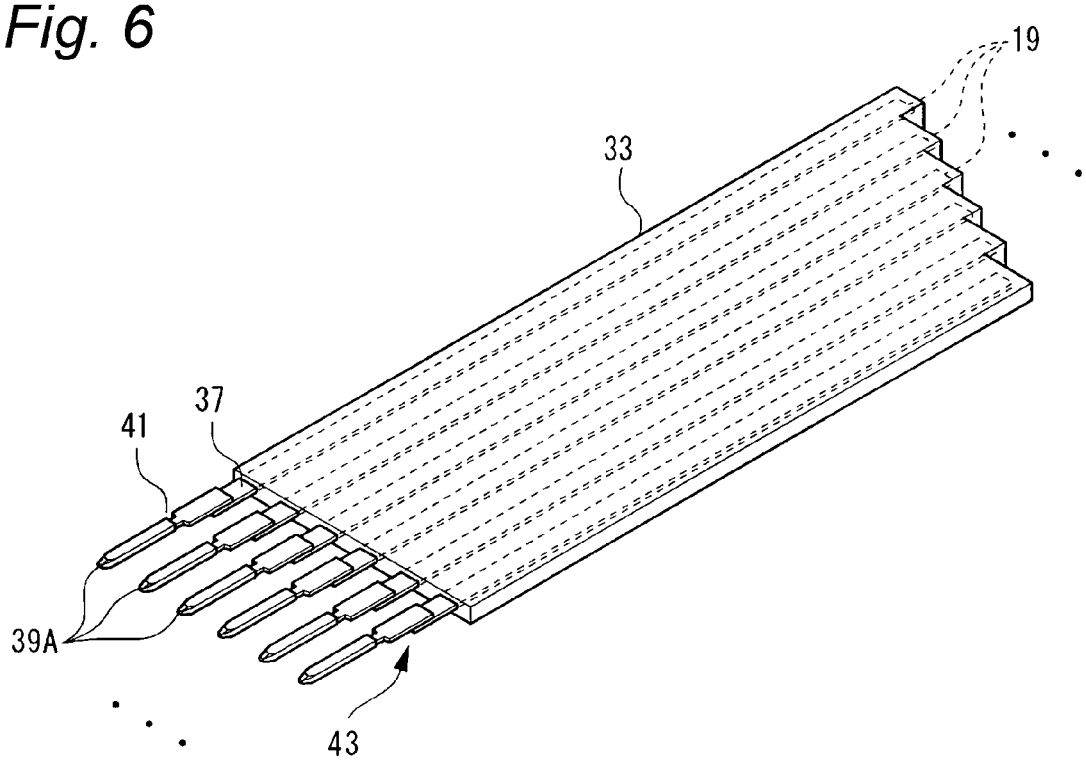
FIG. 6 is a perspective view of a modified intermediate cable arranging member which joins alternative connector terminals.

FIG. 6 is a perspective view of a varied example of an intermediate cable arranging member which is bonded with alternative connector terminals. In the embodiment, in the intermediate cable arranging member 17, although the connector terminals 39 are formed integrally with the branch conductors 19, it is also possible that the connector terminals 39A, or the alternative, are bonded to ends 37 of the branch conductors 19 by bonding parts 43. In this way, it is easy to form connector terminals 39A with a complex shape or connector terminals 39A with a desired thickness. The bonding of the connector terminals 39A and the branch conductors 19 by the bonding parts 43 can be made, as above, by such methods as ultrasonic welding, resistance welding, crimping, soldering and caulking.

Figure 7:
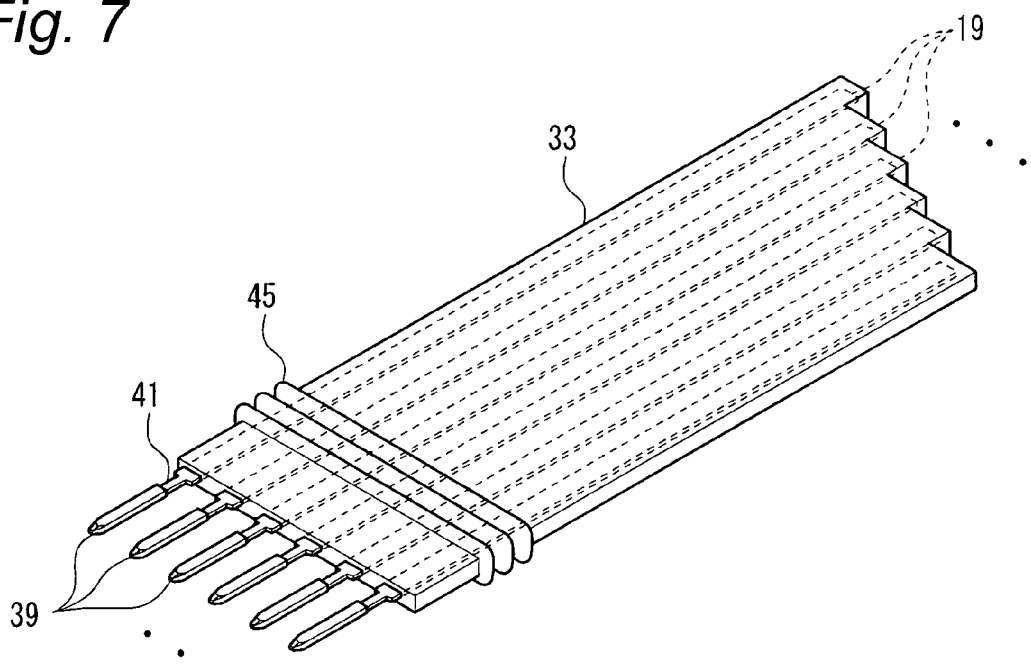
FIG. 7 is a perspective view of an intermediate cable arranging member which has a packing integrally molded with a sheath.
Figure 8:
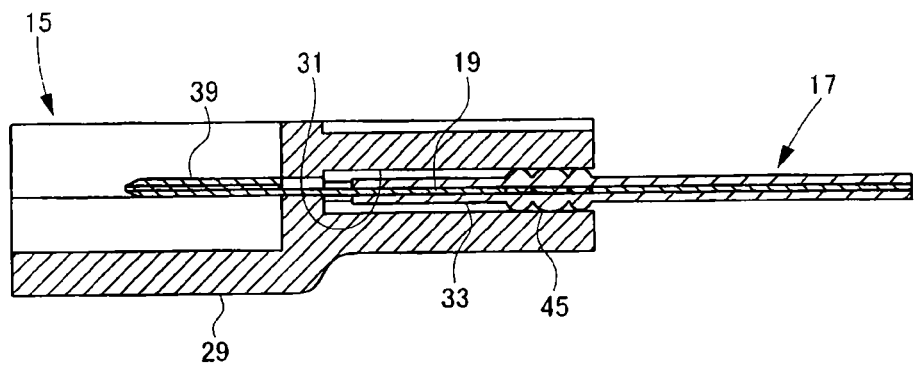
FIG. 8 is a cross section view showing a watertight structure between the intermediate cable arranging member and the connector which uses the packing integrally molded with the sheath.

FIG. 7 is a perspective view of an intermediate cable arranging member having a packing formed integrally with a sheath, and FIG. 8 is a cross section view indicating a watertight structure between the intermediate cable arranging member and a connector which uses the packing formed integrally with the sheath.

Although the gap between the intermediate cable arranging member 17 and the cable guiding opening 31 is sealed by the watertight material filled by the post-processing as described above, besides, it is also possible that the gap between the intermediate cable arranging member 17 and the cable guiding opening 31 is sealed by a packing to prevent water from entering. In this case, a packing 45 which is embedded in the cable guiding opening 31 of the housing 29 can be formed in the intermediate cable arranging member 17.

The packing 45 is formed integrally with the sheath 33. When the branch conductors 19 are coated, the packing 45 can be molded by silicon or the like at the same time. In the intermediate cable arranging member 17 in which the packing 45 is formed integrally with the sheath 33, as shown in FIG. 8, when the intermediate cable arranging member 17 is hold in the connector 15, the gap between the intermediate cable arranging member 17 which is guided out from the housing 29 and the cable guiding opening 31 is sealed by the packing 45 formed integrally with the sheath 33. In other words, without inserting watertight material or assembling another packing, the formation of the watertight structure is complete with the insertion of the intermediate cable arranging member 17 at the same time.

Figure 9A:
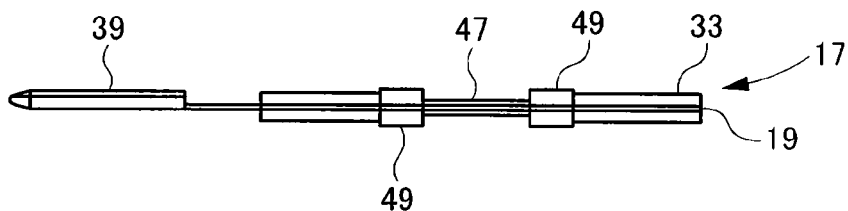
FIG. 9A is a side view of an intermediate cable arranging member in which a packing setting part is formed.
Figure 9B:
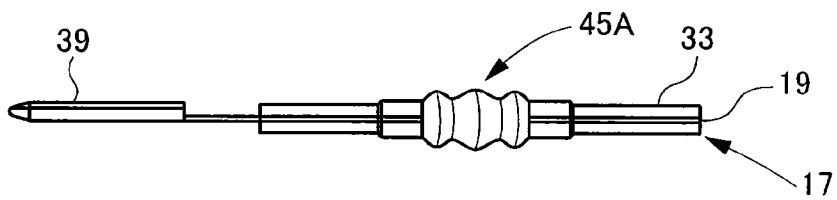
FIG. 9B is a side view of the intermediate cable arranging member in which a packing is installed to the packing setting part.
Figure 10:
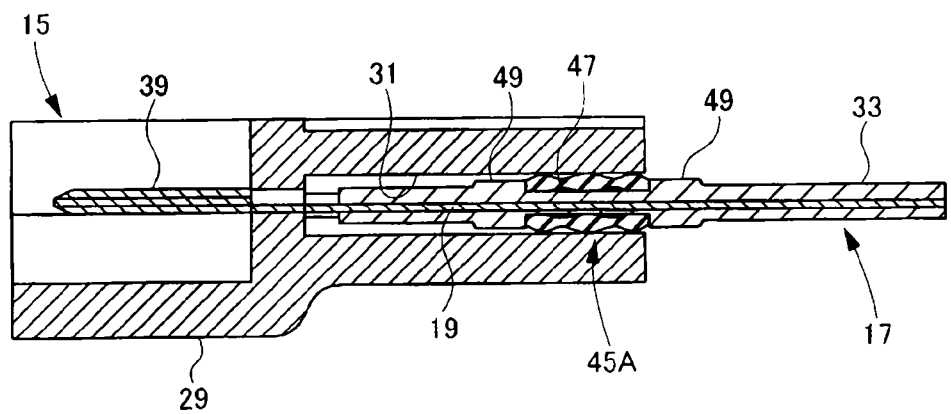
FIG. 10 is a cross section view showing a watertight structure between the intermediate cable arranging member and the connector which uses the alternative packing.

FIG. 9A is a side view of an intermediate cable arranging member in which a packing setting part is formed, FIG. 9B is a side view of the intermediate cable arranging member in which a packing is installed to the packing setting part, and FIG. 10 is a cross section view indicating the watertight structure between the intermediate cable arranging member in which the alternative packing is used and the connector.

A packing setting part 47 which positions the alternative packing 45A can be formed on the sheath 33 of the intermediate cable arranging member 17 at a position close to the connector terminals. The packing setting part 47 can be formed as a circumferential groove by removing some of the circumference of the sheath 33. As shown in FIG. 9, position deviation preventing parts 49 of the packing 45A are formed by projecting the sheath 33 at both sides of the packing setting part 47.

In the intermediate cable arranging member 17 in which the packing setting part 47 is formed and the alternative packing 45A is installed in the packing setting part 47, as shown in FIG. 10, when the intermediate cable arranging member 17 is connected with the connector 15, the gap between the intermediate cable arranging member 17 which is guided out from the housing 29 and the cable guiding opening 31 is sealed by the packing 45A that is installed in the packing setting part 47. Thus, according to the intermediate cable arranging member 17 in which the packing setting part 47 is formed, the alternative packing 45A can be attached to the sheath 33. Thus, the flexibility of selecting materials of the packing 45A increases, and it is possible to replace a deteriorated packing 45A.

Next, steps of a flexible flat cable connecting method will be described.

When the FFC 13 which has the rectangular conductors 11 with an arbitrary pitch is connected with the connector 15 which has the connector terminals 39 with a different pitch, first, the intermediate cable arranging member 17 which has the branch conductors 19 whose array pitch matches with that of the connector terminals 39 is prepared. The connector terminals 39 can be coupled to the ends 37 of the respective branch conductors 19 of the intermediate cable arranging member 17 as described above. In addition, the parts of the intermediate cable arranging member 17 except the connector terminals 39 are covered by the sheath 33. Further, the branch conductors 19 of the intermediate cable arranging member 17 are formed to have longitudinal dimensions different from each other according to the array pitch of the rectangular conductors 11.

The intermediate cable arranging member 17 is laid on the FFC 13 so that the intermediate cable arranging member 17 and the FFC 13 are in the same plane and form an angle. Next, the other ends 21 of the respective branch conductors 19 of the intermediate cable arranging member 17 are connected to the rectangular conductors 11, respectively. If each of the branch conductors 19 is connected to the respective rectangular conductor 11, the sheath 33 of the other end 21 of the intermediate cable arranging member 17 is removed in advance to expose the branch conductor 19. In addition, the insulating coating 25 of the FFC 13 is peeled as described above. In such a state, the branch conductors 19 whose array pitch matches that of the connector terminals 39 is laid on the rectangular conductors 11 of the FFC 13. Next, the rectangular conductors 11 and the branch conductors 19 are bonded by ultrasonic welding, resistance welding, or the like.

After the other end 21 of the intermediate cable arranging member 17 is connected with the FEC 13, the connector terminals 39 provided at the one end 37 of the intermediate cable arranging member 17 are inserted into the connector 15. In the construction that the packing 45 is formed integrally with the one end 37 of the intermediate cable arranging member 17, when the one end 37 of the intermediate cable arranging member 17 is inserted into the cable guiding opening 31 of the connector housing 29, the gap between the intermediate cable arranging member 17 and the cable guiding opening 31 is sealed by the packing 45. In this way, the connecting of the FFC 13 and the connector 15 is finished.

In addition, in the steps of the above connecting method, the intermediate cable arranging member 17 is retained in the connector 15 after the intermediate cable arranging member 17 is connected to the FFC 13. But it is also possible that, conversely, the connector terminals 39 of the intermediate cable arranging member 17 are installed to the connector 15 in advance, and the intermediate cable arranging member 17 that is retained in the connector 15 is connected to the FEC 13.

In the flexible flat cable connecting structure and connecting method as described above, the intermediate cable arranging member 17 is laid on the FFC 13 having a plurality of rectangular conductors 11 provided in parallel at an arbitrary pitch so that the intermediate cable arranging member 17 and the FFC 13 are in the same plane and form an angle, and the branch conductors 19 are connected with the respective rectangular conductor 11 at desired positions along the longitudinal direction of the rectangular conductors 11. Thus, the pitch of the rectangular conductors 11 is converted to the separating distance of the respective branch conductors 19 which are connected with the rectangular conductors 11 at a certain angle (perpendicularly). Therefore, even if the connector 15 is to connect the FFC13 whose pitch is generally narrow and does not match the connector pitch, it becomes possible to form a power supplying construction simply by using the middle cabling component 17 to connect the connector 15 to the FFC 13.

Next, other embodiments of the invention will be described.

Figure 11A:
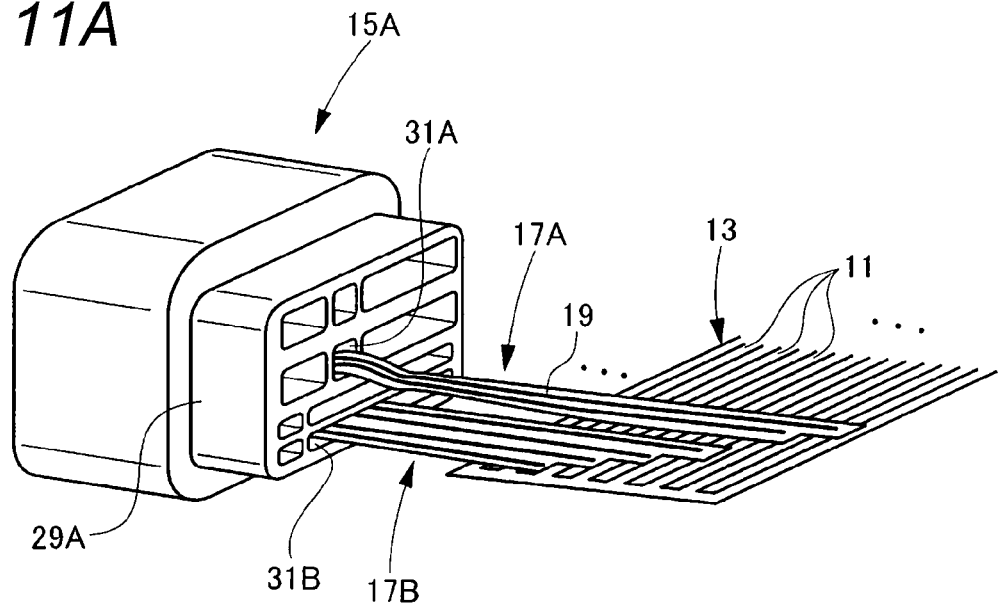
FIG. 11A is a perspective view of a connector in which different intermediate cable arranging members that are connected to the top surface of the flexible flat cable are inserted into different arranging regions of the cable guiding openings.
Figure 11B:
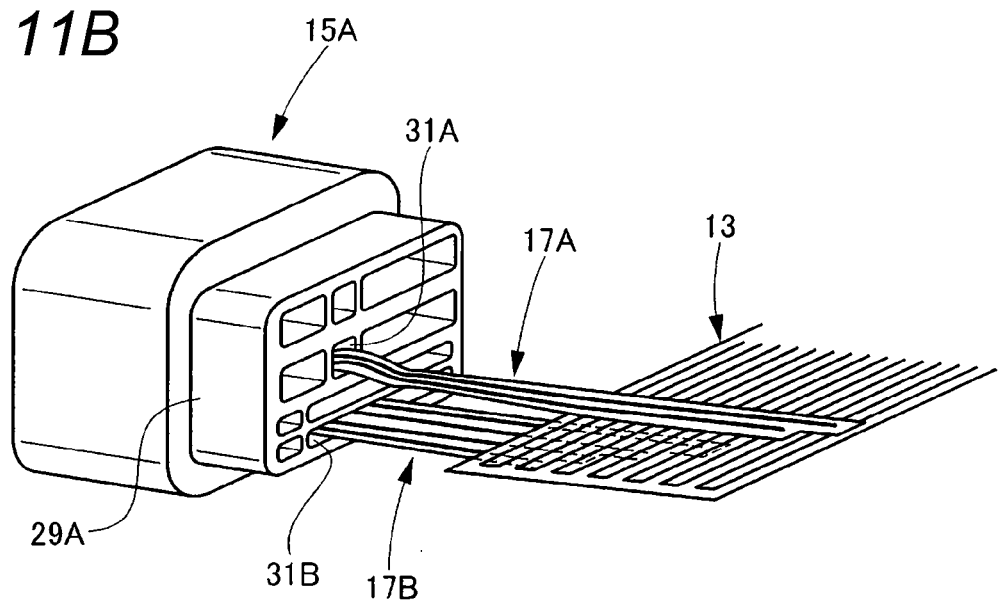
FIG. 11B is a perspective view of a connector in which different intermediate cable arranging members that are connected to the top and the bottom surfaces of the flexible flat cable are inserted into different arranging regions of the cable guiding openings.
Figure 12A:
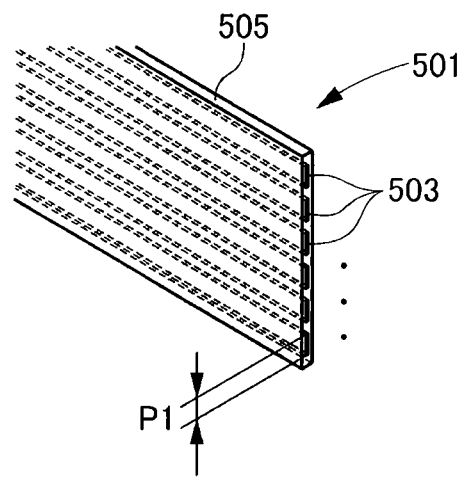
FIG. 12A is a perspective view of a flexible flat cable.
Figure 12B:
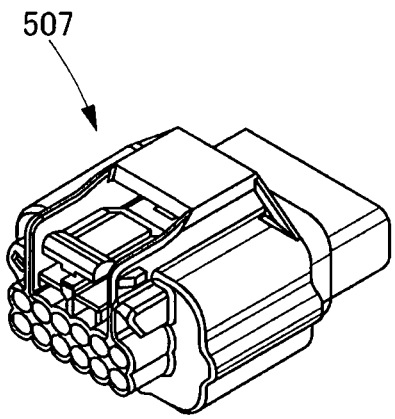
FIG. 12B is a perspective view of a connector.
Figure 12C:
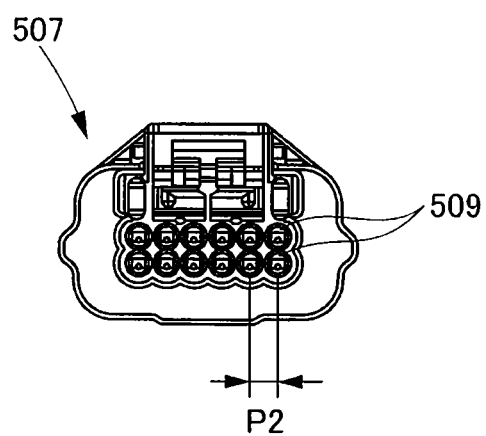
FIG. 12C is a cross section view of the connector perpendicular to a terminal axis of the connector.
Figure 13:
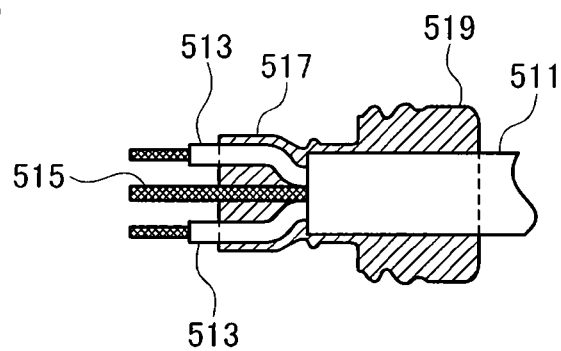
FIG. 13 is a cross section view of a conventional connector connecting structure in which pitch change is made in a mold part.
Figure 14:
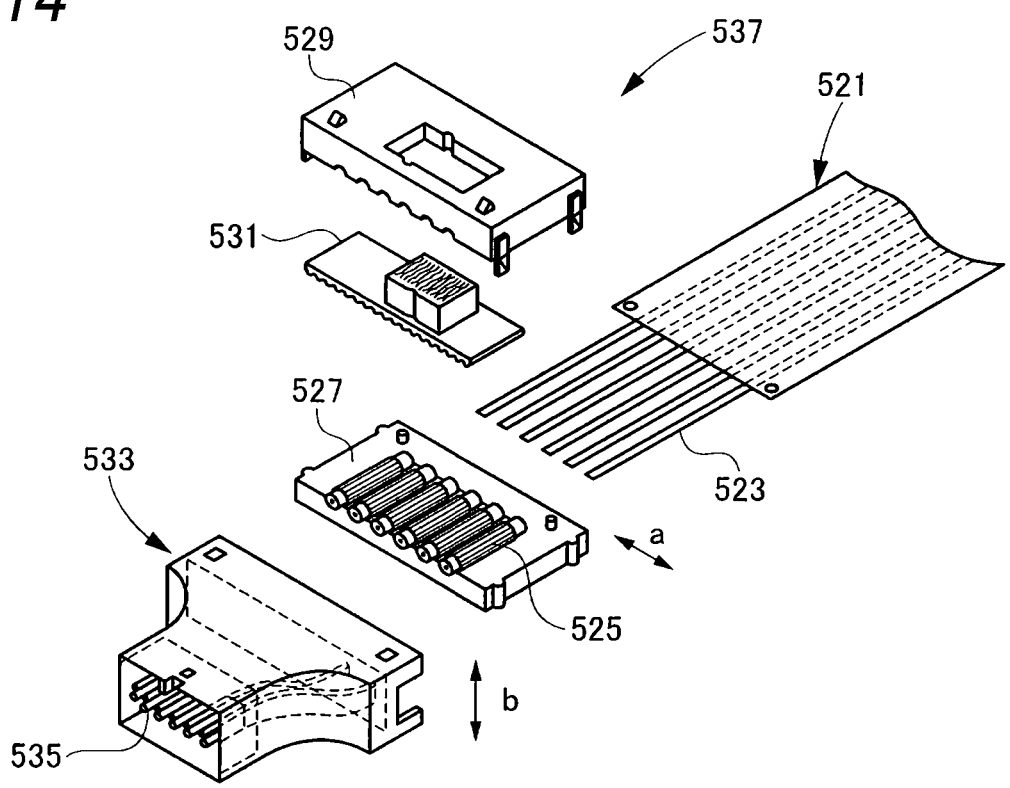
FIG. 14 is an exploded perspective view of a conventional FFC connector in which a direction converting chip is used to vary pitch conversion.

FIG. 11A is a perspective view of a connector in which different intermediate cable arranging members that are connected to the top surface of the flexible flat cable are inserted into different arranging regions of the cable guiding openings, and FIG. 11B is a perspective view of a connector in which different intermediate cable arranging members that are connected to the top and the bottom surfaces of the flexible flat cable are inserted into different arranging regions of the cable guiding openings. The same components as those described in FIGS. 1-10 are given the same symbols, and their descriptions are omitted.

In the connecting structure of the embodiment, a plurality of intermediate cable arranging members 17A and 17B are provided on an FFC 13 at different positions in the cable longitudinal direction. Connector terminals 39 that are provided on the respective intermediate cable arranging members 17A and 17B (referring to FIG. 5) are inserted into cable guiding openings 31A and 31B at different arranging regions of a connector housing 29A.

A plurality of cable guiding openings 31A and 31B of a connector 15A are formed at the rear of the housing 29A. Each of the cable guiding openings 31A and 31B communicates with terminal accommodating chambers not shown in the figure which are provided in the housing 29A. Other components are the same as the above embodiments.

In the embodiment, as shown in FIG. 11A, the intermediate cable arranging member 17A and the intermediate cable arranging member 17B are connected to a surface at one side of the FFC 13 (top surface of the FFC 13), the intermediate cable arranging member 17A is inserted into the upper cable guiding openings 31A, and the intermediate cable arranging member 17B is inserted into the lower cable guiding openings 31B. Therefore, the pitch of the rectangular conductors 11 is column converted to the separating distances of the respective branch conductors 19 of the intermediate cable arranging members 17A and 17B, and is row converted in the different stages of cable guiding openings 31A and 31B. In this example, the intermediate cable arranging members 17A and 17B are divided into two types, and are inserted into two cable guiding openings 31A and 31B in different stages from one FFC 13, but it is also possible that two or more intermediate cable arranging members 17 are inserted into two or more cable guiding openings 31.

In addition, it is also possible that in the intermediate cable arranging members 17A and 17B, as shown in FIG. 11B, the intermediate cable arranging member 17A is connected to the top surface of the FFC 13 and the intermediate cable arranging member 17B is connected to the other surface (bottom surface) of the FFC 13. When connection is made by using both surfaces of the FFC 13 as above, the density of connecting parts decreases and connection can be easily made.

In the connecting structure of the other embodiment, a plurality of intermediate cable arranging members 17A and 17B are connected to one FFC 13, and the respective intermediate cable arranging members 17A and 17B are arranged in different planes. Thus, it is possible to connect to the different stages of cable guiding openings 31A and 31B which are formed in multiple stages at the rear end of the connector housing. That is, not only pitch conversion (column conversion) but also stage conversion (row conversion) of the cable guiding openings 31A and 31B become possible.

Therefore, according to the flexible flat cable connecting structure of the embodiment described above, the intermediate cable arranging member 17, one end 37 of which is coupled to the connector terminals 39 and in which a plurality of branch conductors 19 set to have longitudinal dimensions that are different from each other according to the array pitch are provided in parallel, is laid on the FFC 13 so that the intermediate cable arranging member 17 and the FFC 13 are in the same plane and form an angle, and the other ends 21 of the branch conductors 19 are connected to the respective rectangular conductors 11 of the FFC 13. Thus, the pitch of the rectangular conductors 11 can be arbitrarily converted to the separating distance of the respective branch conductors 19 which are connected to the rectangular conductors 11 at a certain angle (perpendicularly). Therefore, the FFC 13 can be connected to a connector by pitch conversion without complicating the structure of the connector while metal molds for forming mold parts become unnecessary, and moreover the watertight structure is simplified. As a result, productivity can be improved.

In addition, according to the flexible flat cable connecting method of the embodiment described above, the step of laying the intermediate cable arranging member 17, one end 37 of which is coupled to the connector terminals 39 and in which a plurality of branch conductors 19 set to have longitudinal dimensions that are different from each other according to the array pitch are provided in parallel, on the FFC 13 so that the intermediate cable arranging member 17 and the FFC 13 are in the same plane and form an angle, and the step of connecting the other ends 21 of the branch conductors 19 of the intermediate cable arranging member 17 to the respective rectangular conductors 11 are performed. Thus, the pitch of the rectangular conductors 11 can be arbitrarily converted to the separating distance of the respective branch conductors 19 which are connected to the rectangular conductors 11 at a certain angle (perpendicularly). Therefore, the FFC 13 which has the rectangular conductors 11 with an arbitrary pitch can be connected to a connector by pitch conversion without complicating the structure of the connector while metal molds for forming mold parts are not required. As a result, productivity can be improved.

Although the present invention is described in detail with reference to specific embodiments, it is apparent that various modifications and amendments may be made by those skilled in the art without departing from the spirit and scope of the invention.

This application is based on the Japanese patent application (patent application 2009-157870) filed on Jul. 2, 2009, whose content is incorporated herein by reference.

Reference Signs List
11 rectangular conductor
13 FFC (flexible flat cable)
17 intermediate cable arranging member
19 branch conductor
21 the other end
29 housing
39 connector terminal
31A, 31B cable guiding opening (different arranging regions of connector housing)
33 sheath of branch conductors
37 one end
45 packing
47 packing setting part

The invention claimed is:

1. A flexible flat cable connecting structure for connecting a flexible flat cable in which a plurality of rectangular conductors are provided in parallel and a plurality of connector terminals arranged at an array pitch different from that of the rectangular conductors, the flexible flat cable connecting structure comprising:
an intermediate cable arranging member comprising:
one end which is coupled to the connector terminals; and a plurality of branch conductors provided in parallel, the branch conductors being set to have mutually different longitudinal dimensions according to the array pitch, wherein
the connector terminals are formed integrally with the branch conductors
the intermediate cable arranging member being configured to be laid and contact on the flexible flat cable so that the branch conductors and the rectangular conductors form a predetermined angle, and ends of the branch conductors of the intermediate cable arranging member are respectively connected to the rectangular conductors, and
the array pitch of the rectangular conductors is different from the array pitch of the branch conductors at a location where the rectangular conductors respectively contact the branch conductors.

2. The flexible flat cable connecting structure according to claim 1, wherein
the connector terminals are integrally formed with the branch conductors.

3. The flexible flat cable connecting structure according to claim 1, wherein
a sheath of the branch conductors is formed by resin coating.

4. The flexible flat cable connecting structure according to claim 3, wherein
the resin coating is silicon.

5. The flexible flat cable connecting structure according to claim 3, wherein
a packing inserted in a connector housing is integrally molded with the sheath.

6. The flexible flat cable connecting structure according to claim 3, wherein
a packing setting part configured to position a packing is formed on the sheath of the intermediate cable arranging member at a position close to the connector terminals.

7. The flexible flat cable connecting structure according to claim 1, wherein
the intermediate cable arranging member is laid on the flexible flat cable so that the branch conductors and the rectangular conductors form a nearly right angle.

8. The flexible flat cable connecting structure according to claim 1, wherein
a plurality of the intermediate cable arranging members are provided, and the connector terminals for respective intermediate cable arranging members are inserted and locked in different arranging regions of a connector housing.

9. The flexible flat cable connecting structure according to claim 1, wherein
the branch conductors comprise a sheath.

10. The flexible flat cable connecting structure according to claim 1, wherein the array pitch of the branch conductors is different from the array pitch of the rectangular conductors along an entire length of the branch conductors.

11. A flexible flat cable connecting method for connecting a flexible flat cable in which a plurality of rectangular conductors are provided in parallel and a plurality of connector terminals arranged at an array pitch different from that of the rectangular conductors, the flexible flat cable connecting method comprising:
laying an intermediate cable arranging member, one end of which is coupled to the connector terminals and in which a plurality of branch conductors are provided in parallel, on the flexible flat cable so that the intermediate cable arranging member contacts the flexible flat cable and so that the branch conductors and the rectangular conductors form a predetermined angle, the branch conductors being set to have mutually different longitudinal dimensions according to the array pitch, the connector terminals being formed integrally with the branch conductors, and connecting ends of the branch conductors of the intermediate cable arranging member to the rectangular conductors respectively, wherein the array pitch of the rectangular conductors is different from the array pitch of the branch conductors at a location where the rectangular conductors respectively contact the branch conductors.

12. The flexible flat cable connecting method according to claim 11, wherein the array pitch of the branch conductors is different from the array pitch of the rectangular conductors along an entire length of the branch conductors.

\* \* \* \* \*